United States Patent
Zhang

(10) Patent No.: US 9,672,899 B2
(45) Date of Patent: Jun. 6, 2017

(54) DUAL-INVERTER MEMORY DEVICE AND OPERATING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Gong Zhang, Shanghai (CN)

(73) Assignees: Semiconductor Manufacturing International (Shanghai) Corporation (CN); Semiconductor Manufacturing International (Beijing) Corporation (CN)

( * ) Notice: Subject to any disclaimer, the term of this patent is extended or adjusted under 35 U.S.C. 154(b) by 0 days.

(21) Appl. No.: 15/043,165

(22) Filed: Feb. 12, 2016

(65) Prior Publication Data

US 2017/0004875 A1    Jan. 5, 2017

(30) Foreign Application Priority Data

Jun. 30, 2015    (CN) .......................... 2015 1 0373294

(51) Int. Cl.
*G11C 11/00* (2006.01)
*G11C 11/419* (2006.01)
*G11C 11/417* (2006.01)
*G11C 11/412* (2006.01)

(52) U.S. Cl.
CPC .......... *G11C 11/419* (2013.01); *G11C 11/412* (2013.01); *G11C 11/417* (2013.01); *G11C 2213/79* (2013.01)

(58) Field of Classification Search
CPC . G11C 11/412; G11C 11/417; G11C 11/4125; G11C 11/41; G11C 14/00; G11C 2213/79; G11C 29/36
USPC ...................................... 365/154, 156, 63, 72
See application file for complete search history.

(56) References Cited

U.S. PATENT DOCUMENTS

| 4,912,675 | A  | * | 3/1990  | Blake ................... | G11C 11/4125 365/154 |
| 5,631,863 | A  | * | 5/1997  | Fechner .............. | G11C 11/4125 257/903 |
| 5,995,419 | A  | * | 11/1999 | Trimberger .......... | G11C 29/848 365/154 |
| 6,058,041 | A  | * | 5/2000  | Golke ................. | G11C 11/4125 365/154 |
| 7,224,603 | B1 | * | 5/2007  | Plants ................... | G11C 11/412 365/154 |
| 7,558,112 | B2 | * | 7/2009  | Plants ................... | G11C 11/412 365/154 |
| 8,537,603 | B2 | * | 9/2013  | Sekigawa ........... | G11C 11/4125 365/154 |

* cited by examiner

*Primary Examiner* — Gene Auduong
(74) *Attorney, Agent, or Firm* — Innovation Counsel LLP

(57) ABSTRACT

A memory device may include a first inverter, a second inverter, and a control transistor. The control transistor is electrically connected to each of an output terminal of the first inverter and an input terminal of the second inverter for controlling an electrical connection between the output terminal of the first inverter and the input terminal of the second inverter.

19 Claims, 5 Drawing Sheets

DUAL-INVERTER MEMORY DEVICE AND OPERATING METHOD THEREOF

CROSS-REFERENCE TO RELATED APPLICATION

This application claims priority to and benefit of Chinese Patent Application No. 201510373294.7, filed on 30 Jun. 2015; the Chinese Patent Application is incorporated herein by reference in its entirety.

BACKGROUND OF THE INVENTION

The technical field is related to a memory device, a method for operating the memory device, and an electronic device that includes the memory device.

A memory device may be used in write operations for storing data and may be used in read operations for retrieving data. Electric current leakage in a write operation of the memory device may undesirably affect performance of the memory device.

SUMMARY

An embodiment may be related to a memory device. The memory device may include a first inverter, a second inverter, and a control transistor. The control transistor may be electrically connected to each of an output terminal of the first inverter and an input terminal of the second inverter for controlling an electrical connection between the output terminal of the first inverter and the input terminal of the second inverter.

The memory may include a control line that is electrically connected to a gate terminal of the control transistor for transmitting a control signal to the gate terminal of the control transistor.

The control transistor may be an n-channel transistor.

A first terminal of the control transistor may be electrically connected to the output terminal of the first inverter through no intervening transistor. A second terminal of the control transistor may be electrically connected to the input terminal of the second inverter through no intervening transistor.

The control transistor may be configured to be off in a write operation of the memory device. The control transistor may be configured to be on in a read operation of the memory device. The control transistor may be configured to be on in a hold operation of the memory device.

The memory device 1 may include a first access transistor and a first bit line. A drain terminal of the first access transistor may be electrically connected through the control transistor to the output terminal of the first inverter. The first bit line may be electrically connected to a source terminal of the first access transistor. The drain terminal of the first access transistor may be electrically connected, through no intervening transistor, to both the input terminal of the second inverter and the second terminal of the control transistor. The control transistor may be configured to be off when the first access transistor is on.

The memory device may include a second access transistor and a second bit line. A source terminal of the second access transistor may be electrically connected to the output terminal of the second inverter. The second bit line may be electrically connected to a drain terminal of the second access transistor. The control transistor may be configured to be on when the second access transistor is on and when the first access transistor is off. The control transistor may be configured to be on when both the first access transistor and the second access transistor are off.

An embodiment may be related to a method of operating a memory device. The memory device may include a first inverter and a second inverter. The method may include operating the memory device in a write operation. The method may include disconnecting an output terminal of the first inverter from an input terminal of the second inverter, i.e., disconnecting an electrical connection between the output terminal of the first inverter and the input terminal of the second inverter, in (or during) the write operation.

The method include operating a control transistor to perform the disconnecting, i.e., to disconnect the electrical connection. A first terminal of the control transistor may be electrically connected to the output terminal of the first inverter through no intervening transistor. A second terminal of the control transistor may be electrically connected to an input terminal of the second inverter through no intervening transistor.

The method may include the following steps: switching on a first access transistor for performing the write operation; and switching off the control transistor when or after switching on the first access transistor. A drain terminal of the first access transistor may be electrically connected through the control transistor to the output terminal of the first inverter. The method may include disconnecting the output terminal of the first inverter from a drain terminal of the first access transistor, i.e., disconnecting an electrical path between the output terminal of the first inverter and the drain terminal of the first access transistor, in (or during) the write operation.

The method may include the following steps: switching off the first access transistor and switching on a second access transistor for performing a read operation of the memory device; and switching on the control transistor when or after switching on the second access transistor. A source terminal of the second access transistor may be electrically connected to the output terminal of the second inverter.

The method may include the following steps: switching off the first access transistor and switching off a second access transistor for performing a hold operation of the memory device; and switching on the control transistor when after switching off at least one of the first access transistor and the second access transistor. A source terminal of the second access transistor may be electrically connected to the output terminal of the second inverter.

The method may include the following steps: operating the memory device in a hold operation; and operating the control transistor to electrically connect the output terminal of the first inverter to the input terminal of the second inverter in (or during) the hold operation. The method may include operating the memory device in a read operation. The control transistor may remain in an on state in (or during) the read operation.

The method of may include operating the memory device in a read operation. The control transistor may electrically connect the output terminal of the first inverter to the input terminal of the second inverter in (or during) the read operation.

An embodiment may be related to an electronic device. The electronic device may include an electronic component and a memory device electrically connected to the electronic component. The memory device may have one or more aforementioned features.

According to embodiments, electric current leakage may be minimized or substantially prevented in write operations of a memory device. Advantageously, satisfactory performance of the memory device may be substantially attained.

The above summary is related to some of many embodiments of the invention disclosed herein and is not intended to limit the scope of the invention.

DETAILED DESCRIPTION

Figure 1:
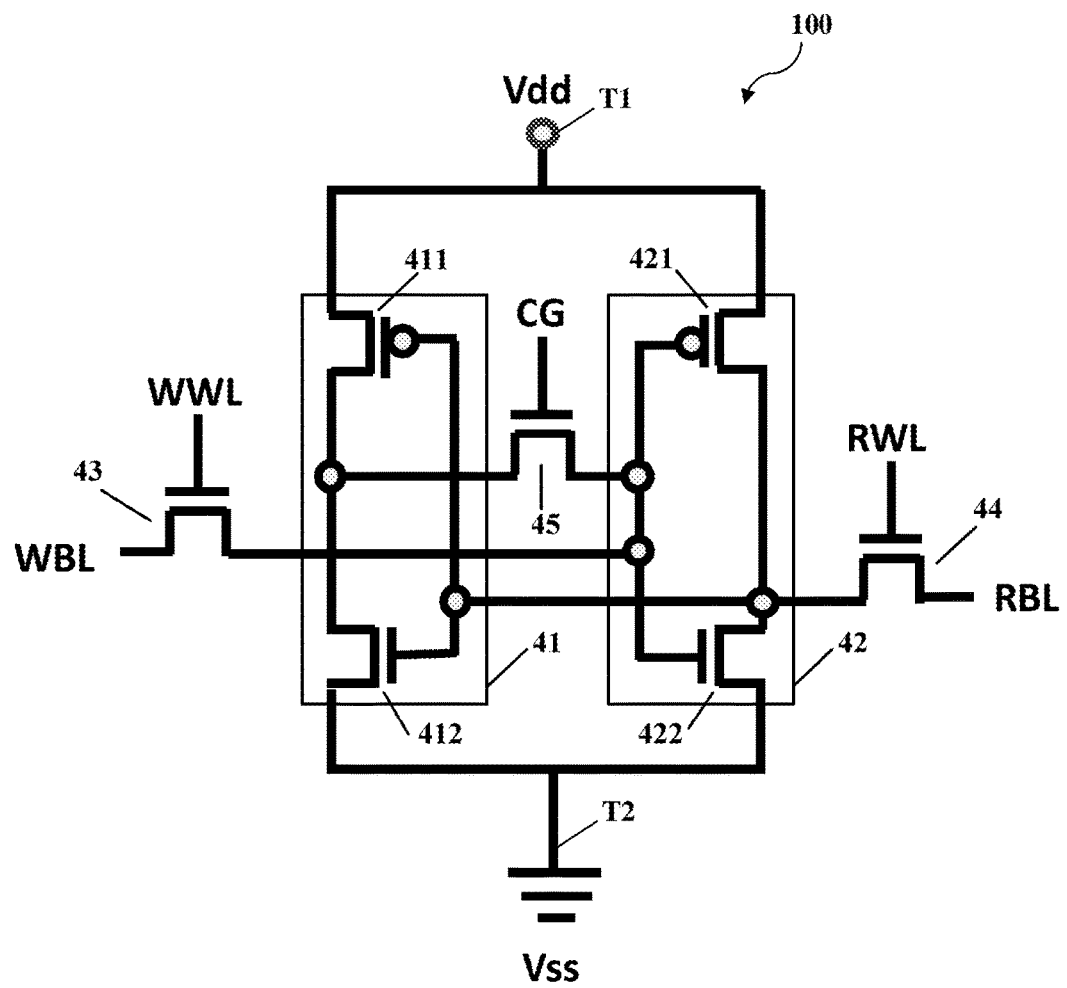
FIG. 1 shows a schematic diagram (e.g., a schematic circuit diagram) that illustrates elements and/or structures in a memory device in accordance with one or more embodiments.

Example embodiments are described with reference to the accompanying drawings. As those skilled in the art would realize, the described embodiments may be modified in various different ways, all without departing from the spirit or scope. Embodiments may be practiced without some or all of these specific details. Well known process steps and/or structures may not have been described in detail in order to not unnecessarily obscure described embodiments.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting possible embodiments. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements should not be limited by these terms. These terms may be used to distinguish one element from another element. Thus, a first element discussed below may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may be provided between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the embodiments. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive". The term "electrically connected" may mean "electrically connected without any intervening transistors".

Unless explicitly described to the contrary, the word "comprise" and variations such as "comprises", "comprising", "include", or "including" may imply the inclusion of stated elements but not the exclusion of other elements.

One or more the electrical connections described in this application may be connected through no intervening transistor.

Various embodiments, including methods and techniques, are described in this disclosure. Embodiments may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, embodiments may also cover apparatuses for practicing embodiments. Such apparatus may include circuits, dedicated and/or programmable, to carry out operations pertaining to embodiments. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments.

FIG. 1 shows a schematic diagram (e.g., a schematic circuit diagram) that illustrates elements and/or structures in a memory device 100 in accordance with one or more embodiments. The memory device 100 may be a static random-access memory (SRAM) device. The memory device 100 may include a power supply terminal T1, a power supply terminal T2, an inverter 41, an inverter 42, an access transistor 43, and an access transistor 44, and a control transistor 45.

The power supply terminal T1 may receive a voltage Vdd. The voltage Vdd may be a positive power supply voltage.

The power supply terminal T2 may receive a voltage Vss. The voltage Vss may be a negative power supply voltage and/or a ground voltage.

The inverter 41 may include a p-channel transistor 411 and an n-channel transistor 412. The source terminal of the p-channel transistor 411 may be electrically connected to the power supply terminal T1. The source terminal of the n-channel transistor 412 may be electrically connected to the power supply terminal T2. The drain terminal of the p-channel transistor 411, the drain terminal of the n-channel transistor 412, the output terminal of the inverter 41, and a first terminal of the control transistor 45 may be electrically connected to one another. A second terminal of the control transistor 45 may be electrically connected to a terminal (e.g., the drain terminal) of the access transistor 43. The gate terminal of the p-channel transistor 411, the gate terminal of the n-channel transistor 412, the input terminal of the inverter 41, and a terminal (e.g., the source terminal) of the access transistor 44 may be electrically connected to one another.

The inverter 42 may include a p-channel transistor 421 and an n-channel transistor 422. The source terminal of the p-channel transistor 421 may be electrically connected to the power supply terminal T1. The source terminal of the n-channel transistor 422 may be electrically connected to the power supply terminal T2. The drain terminal of the p-channel transistor 421, the drain terminal of the n-channel transistor 422, the output terminal of the inverter 42, and a terminal (e.g., the source terminal) of the access transistor 44 may be electrically connected to one another. The gate terminal of the p-channel transistor 421, the gate terminal of the n-channel transistor 422, the input terminal of the inverter 42, a terminal (e.g., the drain terminal) of the access transistor 43, and the second terminal of the control transistor 45 may be electrically connected to one another.

Each of the inverter 41 and the inverter 42 may be a complementary metal-oxide-semiconductor (CMOS) unit. Each of the p-channel transistors 411 and 421 may be a p-channel metal-oxide-semiconductor (PMOS) transistor. Each of the n-channel transistors 412 and 422 may be an n-channel metal-oxide-semiconductor (NMOS) transistor. One or more of the transistors in the memory device 100 may have one or more fin structures.

The memory device 100 may include a word line WWL (or write word line WWL), a word line RWL (or read word line RWL), a bit line WBL (or write bit line WBL), a bit line RBL (or read bit line RBL), and a control line CG. The word line WWL, the word line RWL, the bit line WBL, and the bit line RBL, and the control line CG may be insulated from one another, for transmitting different signals.

The word line WWL may be electrically connected to the gate terminal of the access transistor 43. The word line RWL may be electrically connected to the gate terminal of the access transistor 44. The bit line WBL may be electrically connected to a terminal (e.g., the source terminal) of the access transistor 43. The bit line RBL may be electrically connected to a terminal (e.g., the drain terminal) of the access transistor 44. The control line CG may be electrically connected to the gate terminal of the control transistor 45 for transmitting a control signal to the gate terminal of the control transistor 45.

The control transistor 45 may be electrically connected to each of the output terminal of the inverter 41 and the input terminal of the inverter 42 for controlling an electrical connection between the output terminal of the inverter 41 and the input terminal of the inverter 42. The control transistor 45 may be an n-channel transistor, e.g., an NMOS transistor. The first terminal of the control transistor 45 may be electrically connected to the output terminal of the inverter 41. The second terminal of the control transistor 45 may be electrically connected to the input terminal of the inverter 42.

The control transistor 45 may be configured to be off in a write operation of the memory device 100. The control transistor 45 may be configured to be on in a read operation of the memory device 100. The control transistor 45 may be configured to be on in a hold operation of the memory device 100.

The drain terminal of the access transistor 43 may be electrically connected, through no intervening transistor, to both the input terminal of the inverter 42 and the second terminal of the control transistor 45. The drain terminal of the access transistor 43 may be electrically connected through the control transistor 45 to the output terminal of the inverter 41. The source terminal of the access transistor 43 may be electrically connected to the bit line WBL. The control transistor 45 may be configured to be off when the access transistor 43 is on for performing the write operation of the memory device 100.

The source terminal of the access transistor 44 may be electrically connected to the output terminal of the inverter 42. The drain terminal of the access transistor 44 may be electrically connected to the bit line RBL. The control transistor 45 may be configured to be on when the access transistor 44 is on and when the access transistor 43 is off for performing the read operation of the memory device 100. The control transistor 45 may be configured to be on when both the access transistor 43 and the access transistor 44 are off for performing the hold operation of the memory device.

Figure 2:
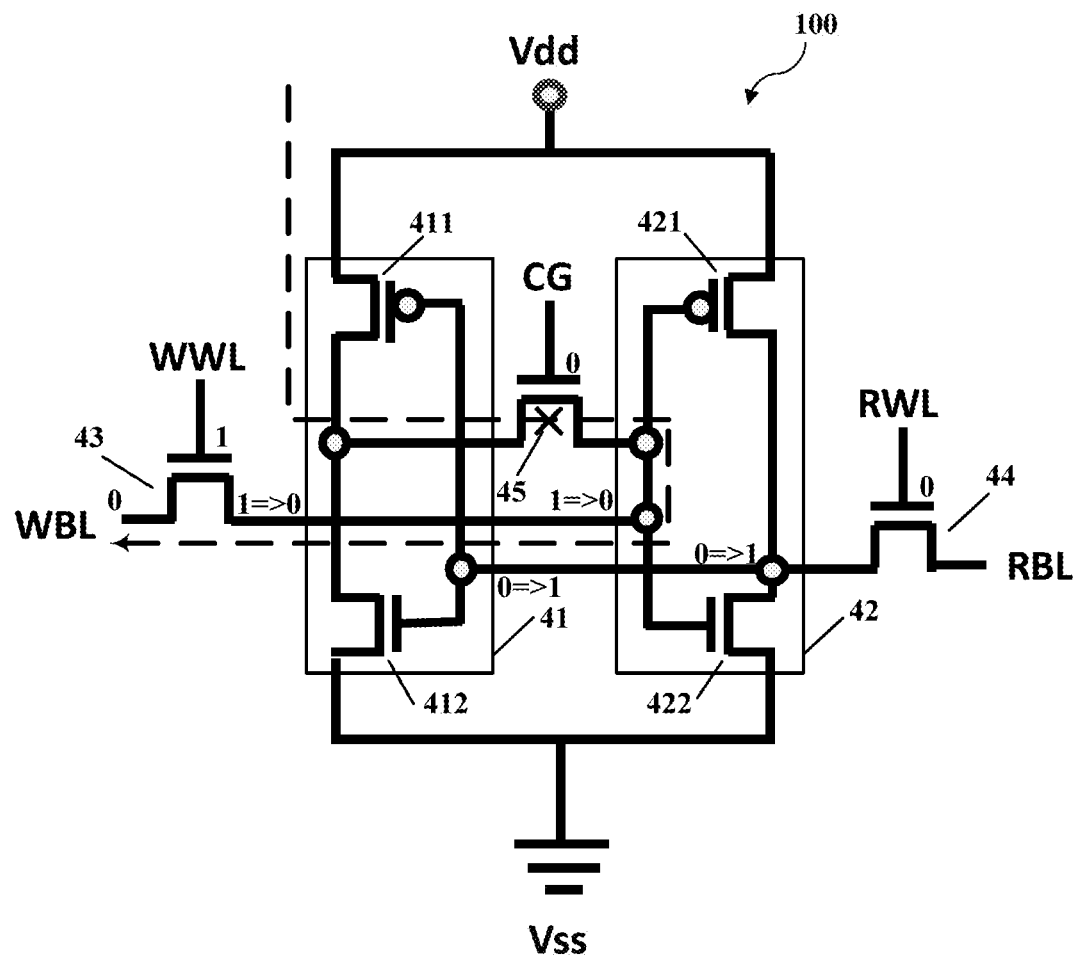
FIG. 2 shows a schematic diagram that illustrates a write operation of a memory device in accordance with one or more embodiments.

FIG. 2 shows a schematic diagram that illustrates a write operation of the memory device 100 for writing "0" in the memory device 100 in accordance with one or more embodiments.

For performing the write operation, the source terminal of the access transistor 43 may receive a signal "0" (or low voltage), the gate terminal of the access transistor 43 may receive a signal "1" (or high voltage) to switch on the access transistor 43, the drain terminal of the access transistor 43 may receive the signal "0" (with the corresponding value changing from 1 to 0 and/or voltage changing from high to low), and the gate terminal of the access transistor 44 may receive a signal "0" (or low voltage) to switch off the access transistor 44. Therefore, the input terminal of the inverter 42 may receive the signal "0" (with the corresponding value changing from 1 to 0 and/or voltage changing from high to low), and each of the output terminal of the inverter 42 and the input terminal of the inverter 41 may receive a signal "1" (with the corresponding value changing from 0 to 1 and/or voltage changing from low to high).

In (and/or during) the write operation, e.g., when and/or after the switching-on of the access transistor 43 and/or the switching-off of the access transistor 44, the gate terminal of the control transistor 45 may receive a signal "0" (or low voltage) to switch off (and keep off) the control transistor 45. Therefore, the output terminal of the inverter 41 may be disconnected from the input terminal of the inverter 42 and the access transistor 43. Advantageously, potential electric current leakage through the access transistor may 43 be minimized or substantially prevented.

Figure 3:
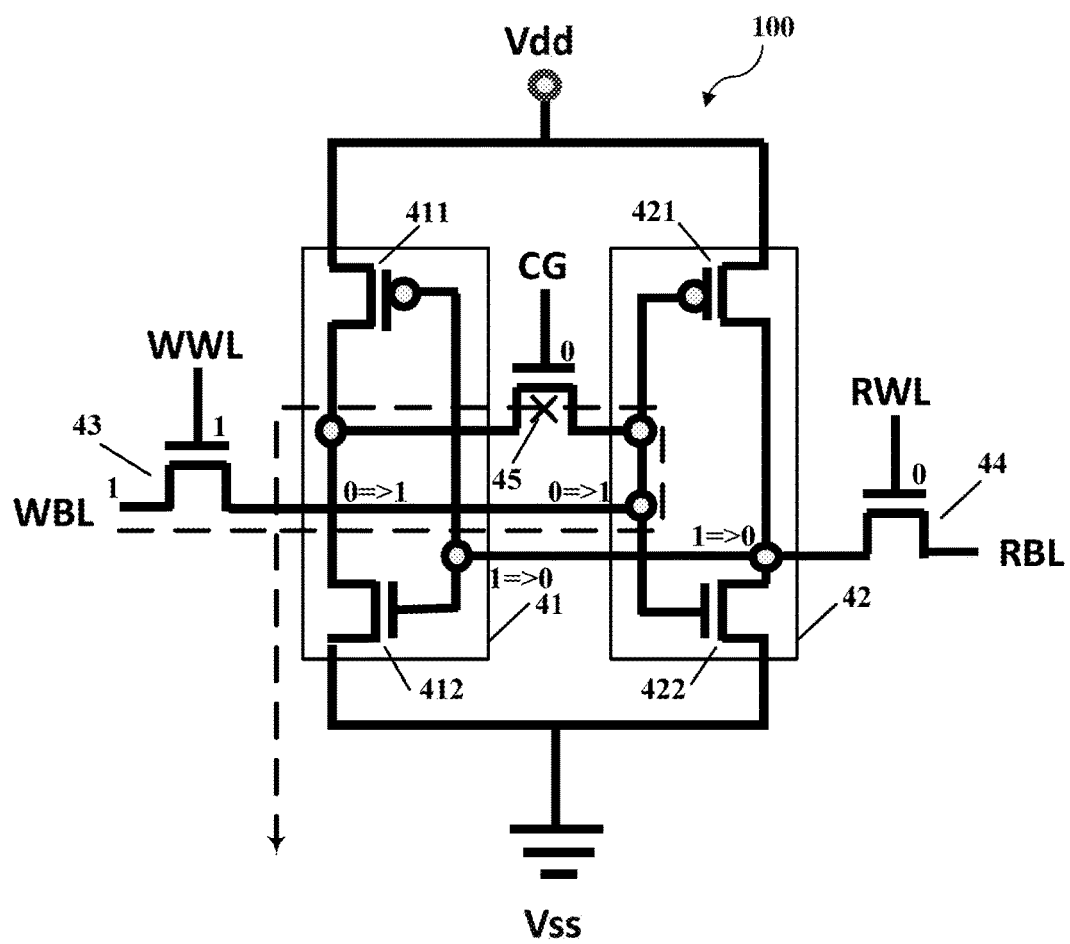
FIG. 3 shows a schematic diagram that illustrates a write operation of a memory device in accordance with one or more embodiments.

FIG. 3 shows a schematic diagram that illustrates a write operation of the memory device 100 for writing "1" in the memory device 100 in accordance with one or more embodiments.

For performing the write operation, the source terminal of the access transistor 43 may receive a signal "1" (or high voltage), the gate terminal of the access transistor 43 may receive a signal "1" (or high voltage) to switch on the access transistor 43, the drain terminal of the access transistor 43 may receive the signal "1" (with the corresponding value changing from 0 to 1 and/or voltage changing from low to high), and the gate terminal of the access transistor 44 may receive a signal "0" (or low voltage) to switch off the access transistor 44. Therefore, the input terminal of the inverter 42 may receive the signal "1" (with the corresponding value changing from 0 to 1 and/or voltage changing from low to high), and each of the output terminal of the inverter 42 and the input terminal of the inverter 41 may receive a signal "0" (with the corresponding value changing from 1 to 0 and/or voltage changing from high to low).

In (and/or during) the write operation, e.g., when and/or after the switching-on of the access transistor 43 and/or the switching-off of the access transistor 44, the gate terminal of the control transistor 45 may receive a signal "0" (or low voltage) to switch off (and keep off) the control transistor 45. Therefore, the output terminal of the inverter 41 and the n-channel transistor 412 may be disconnected from the input terminal of the inverter 42 and the access transistor 43. Advantageously, potential electric current leakage through the n-channel transistor 412 may be minimized or substantially prevented.

Figure 4:
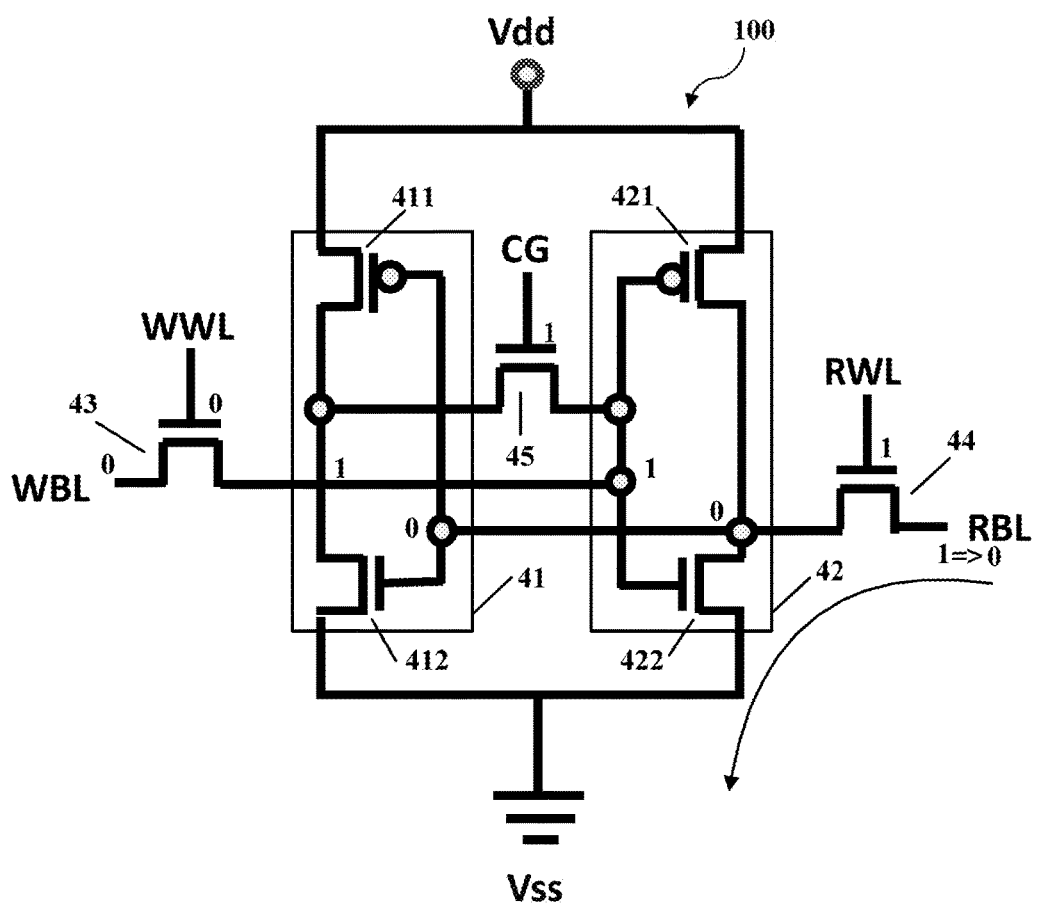
FIG. 4 shows a schematic diagram that illustrates a read operation of a memory device in accordance with one or more embodiments.

FIG. 4 shows a schematic diagram that illustrates a read operation of the memory device 100 in accordance with one or more embodiments.

For performing the read operation, the drain terminal (or a terminal) of the access transistor 44 may receive a signal "1" (for pre-charging with a high voltage), the gate terminal of the access transistor 44 may receive a signal "1" (or high voltage) to switch on the access transistor 44, and the source terminal of the access transistor 43 may receive a signal "0" (or low voltage). The gate terminal of the access transistor 43 may receive a signal "0" (or low voltage) to switch off the access transistor 43. In (and/or during) the read operation, e.g., when and/or after the switching-off of the access transistor 43 and/or the switching-on of the access transistor 44, the gate terminal of the control transistor 45 may receive a signal "1" (or high voltage) to switch on (and/or keep on) the control transistor 45, such that the output terminal of the inverter 41 may be electrically connected (or re-connected) to the input terminal of the inverter 42. Therefore, each the drain terminal of the access transistor 43, the input terminal of the inverter 42, and the output terminal of the inverter 41 may keep the value "1" at a high voltage; each of the input terminal of the inverter 41 and the output terminal of the inverter 42 may keep the value "0" at a low voltage. As a result, current may be discharged through the n-channel transistor 422, and the value at the (drain) terminal of the access transistor 44 (and at the bit line RBL) may change to 0.

Figure 5:
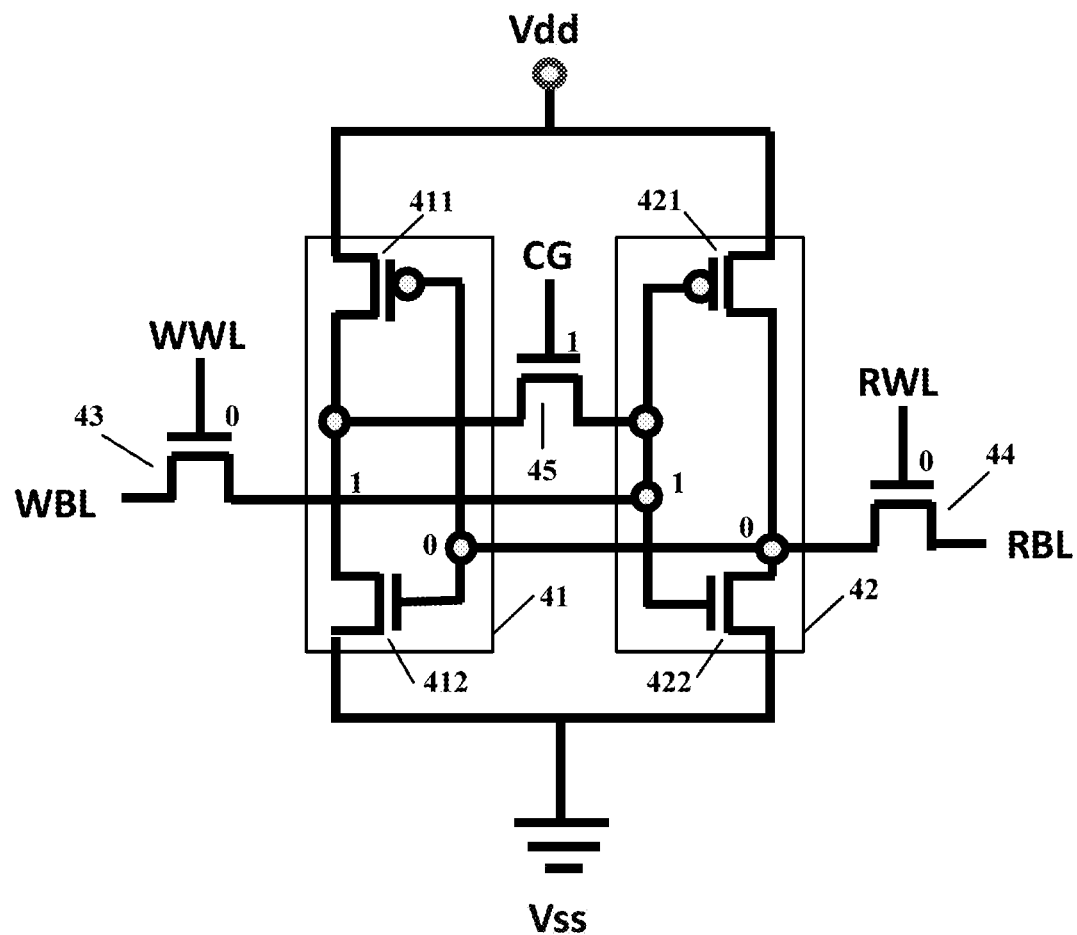
FIG. 5 shows a schematic diagram that illustrates a hold operation of a memory device in accordance with one or more embodiments.

FIG. 5 shows a schematic diagram that illustrates a hold operation of the memory device 100 in accordance with one or more embodiments.

For performing the hold operation, The gate terminal of the access transistor 43 may receive a signal "0" (or low voltage) to switch off the access transistor 43, and the gate terminal of the access transistor 44 may receive a signal "0" (or low voltage) to switch off the access transistor 44. In (and/or during) the hold operation, e.g., when and/or after the switching-off of the access transistor 43 and/or the switching-off of the access transistor 44, the gate terminal of the control transistor 45 may receive a signal "1" (or high voltage) to switch on (and keep on) the control transistor 45, such that the output terminal of the inverter 41 may be electrically connected (or re-connected) to the input terminal of the inverter 42. Therefore, each the drain terminal of the access transistor 43, the input terminal of the inverter 42, and the output terminal of the inverter 41 may keep the value "1" at a high voltage; each of the input terminal of the inverter 41 and the output terminal of the inverter 42 may keep the value "0" at a low voltage.

According to embodiments, electric current leakage may be minimized or substantially prevented in write operations of the memory device 100. Advantageously, satisfactory performance of the memory device 100 may be substantially attained.

While some embodiments have been described as examples, there are alterations, permutations, and equivalents. It should also be noted that there are many alternative ways of implementing the methods and apparatuses. Furthermore, embodiments may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents.

What is claimed is:

1. A memory device comprising:
   a first inverter;
   a second inverter, wherein an output terminal of the second inverter is electrically connected to an input terminal of the first inverter;
   a control transistor electrically connected to each of an output terminal of the first inverter and an input terminal of the second inverter for controlling an electrical connection between the output terminal of the first inverter and the input terminal of the second inverter;
   a first access transistor, wherein a drain terminal of the first access transistor is electrically connected through the control transistor to the output terminal of the first inverter; and
   a second access transistor, wherein a source terminal of the second access transistor is electrically connected to the output terminal of the second inverter.

2. The memory device of claim 1 comprising: a control line electrically connected to a gate terminal of the control transistor for transmitting a control signal to the gate terminal of the control transistor.

3. The memory device of claim 1, wherein the control transistor is an n-channel transistor.

4. The memory device of claim 1, wherein a first terminal of the control transistor is electrically connected to the output terminal of the first inverter through no intervening transistor, and wherein a second terminal of the control transistor is electrically connected to the input terminal of the second inverter through no intervening transistor.

5. The memory device of claim 1, wherein the control transistor is configured to be off in a write operation of the memory device.

6. The memory device of claim 1, wherein the control transistor is configured to be on in a read operation of the memory device.

7. The memory device of claim 1, wherein the control transistor is configured to be on in a hold operation of the memory device.

8. The memory device of claim 1, further comprising: a first bit line electrically connected to a source terminal of the first access transistor.

9. The memory device of claim 8, wherein the drain terminal of the first access transistor is electrically connected to both the input terminal of the second inverter and the second terminal of the control transistor.

10. The memory device of claim 8, wherein the control transistor is configured to be off when the first access transistor is on.

11. The memory device of claim 8, further comprising: a second bit line electrically connected to a drain terminal of the second access transistor,
wherein the control transistor is configured to be on when the second access transistor is on.

12. The memory device of claim 8, further comprising: a second bit line electrically connected to a drain terminal of the second access transistor,
wherein the control transistor is configured to be on when both the first access transistor and the second access transistor are off.

13. A method of operating a memory device, the memory device comprising a first inverter and a second inverter, the method comprising:
operating the memory device in a write operation;
disconnecting an output terminal of the first inverter from an input terminal of the second inverter in the write operation;
operating a control transistor to perform the disconnecting, wherein a first terminal of the control transistor is electrically connected to the output terminal of the first inverter, and wherein a second terminal of the control transistor is electrically connected to an input terminal of the second inverter;
switching on a first access transistor for performing the write operation, wherein a drain terminal of the first access transistor is electrically connected through the control transistor to the output terminal of the first inverter; and
switching off the first access transistor and switching off a second access transistor for performing a hold operation of the memory device, wherein a source terminal of the second access transistor is electrically connected to the output terminal of the second inverter.

14. The method of claim 13 comprising:
switching off the control transistor when or after the switching on the first access transistor.

15. The method of claim 14 comprising:
disconnecting an electrical path between the output terminal of the first inverter and a drain terminal of the first access transistor during the write operation.

16. The method of claim 14 comprising:
switching on the control transistor when or after the switching on the second access transistor.

17. The method of claim 14 comprising:
switching on the control transistor when after switching off at least one of the first access transistor and the second access transistor.

18. The method of claim 13, comprising:
operating the memory device in a hold operation; and
operating the control transistor to electrically connect the output terminal of the first inverter to the input terminal of the second inverter during the hold operation.

19. The method of 13, comprising:
operating the memory device in a read operation, wherein the control transistor electrically connects the output terminal of the first inverter to the input terminal of the second inverter during the read operation.

* * * * *